United States Patent
Sumitomo et al.

(10) Patent No.: US 8,253,926 B2
(45) Date of Patent: Aug. 28, 2012

(54) EXPOSURE DEVICE

(75) Inventors: Taku Sumitomo, Himeji (JP); Kiyoyuki Kabuki, Himeji (JP); Toshio Yokota, Himeji (JP)

(73) Assignees: Ushio Denki Kabushiki Kaisha, Tokyo (JP); Energetiq Technology, Inc., Woburn, MA (US)

( * ) Notice: Subject to any disclaimer, the term of this patent is extended or adjusted under 35 U.S.C. 154(b) by 470 days.

(21) Appl. No.: 12/565,881

(22) Filed: Sep. 24, 2009

(65) Prior Publication Data

US 2010/0085549 A1   Apr. 8, 2010

(30) Foreign Application Priority Data

Oct. 2, 2008   (JP) ................. 2008-256965

(51) Int. Cl.
G03B 27/72   (2006.01)
G03B 27/54   (2006.01)

(52) U.S. Cl. .......................... 355/69; 355/67

(58) Field of Classification Search ............ 355/53, 355/67–69; 361/121; 250/504 R; 371/22, 371/34

See application file for complete search history.

(56) References Cited

U.S. PATENT DOCUMENTS

| 7,091,507 B2 * | 8/2006 | Masaki et al. ............ 250/504 R |
| 7,491,954 B2 * | 2/2009 | Bykanov et al. .......... 250/504 R |
| 2002/0008863 A1 | 1/2002 | Taniguchi et al. |
| 2007/0228288 A1 | 10/2007 | Smith |
| 2007/0228300 A1 | 10/2007 | Smith |

FOREIGN PATENT DOCUMENTS

| JP | 61-193358 A | 8/1986 |
| JP | 61193358 | * 8/1986 |

* cited by examiner

*Primary Examiner* — Hung Henry Nguyen
(74) *Attorney, Agent, or Firm* — Roberts Mlotkowski Safran & Cole, P.C.; David S. Safran

(57) ABSTRACT

An exposure device for producing semiconductors and liquid crystals has an optical system capable of effectively using light generated without making a hole in a lamp discharge vessel when high energy laser light is supplied to it for emitting light, such as ultraviolet light. The exposure device has a light source for emitting ultraviolet light, a laser device for emitting laser light, an elliptical reflector for reflecting ultraviolet light emitted from the light source, and an optical system for directing light reflected by the elliptical reflector to an article to be treated via optical elements including a collimator lens and an integrator lens, and a beam splitter having a wavelength selecting ability provided in the optical path for light reflected by the elliptical reflector to allow laser light to be incident on the light source from and opening side of the elliptical reflector.

12 Claims, 3 Drawing Sheets

Fig. 5
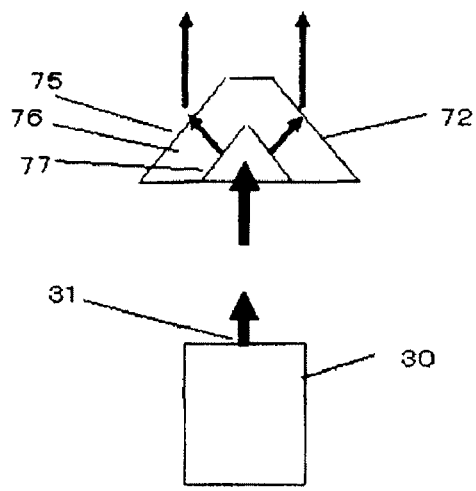
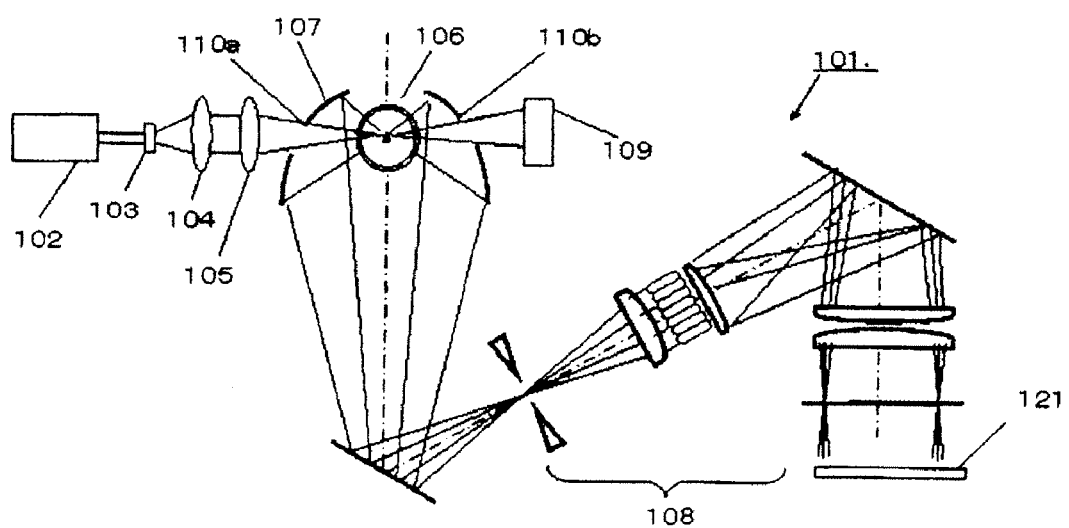
Fig. 6 (Prior Art)

EXPOSURE DEVICE

BACKGROUND OF THE INVENTION

1. Field of the Invention

The present invention relates to an exposure device used in the process of producing semiconductors, liquid crystal substrates, color films and the like, particularly relates to an exposure device provided with a light source for emitting light in the ultraviolet region, for example, wherein laser light is used as a means for supplying energy to the light source.

2. Description of Related Art

Progress has recently been made for reducing treatment time and subjecting an object to be treated having a large area to one-shot exposure in the process for producing semiconductors, liquid crystal substrates, color films and the like using an ultraviolet light source, which has a large input voltage. Accordingly, there is a need for the emission of light having a higher intensity of a high-pressure discharge lamp, which is a UV light source. However, the problem associated with simply increasing an input voltage applied to a high-pressure discharge lamp is that the load applied to the electrodes disposed within the discharge vessel increases, leading to the production of vaporized material from the electrodes. As a result, the high-pressure discharge lamp may be blackened and its lifetime reduced.

A wide variety of proposals have been made for solving the above-mentioned problems. As an example, JP-A-61-193385 discloses a method for emitting light by disposing an electrodeless discharge lamp inside an elliptical reflector and emitting laser light to a discharge vessel of the discharge lamp through a opening part provided on the side face of the elliptical reflector to excite a discharge gas sealed inside the discharge vessel. This technology enables to avoid the problem that the lifetime of the lamp is reduced, which is caused by the blackening of the discharge vessel caused by the evaporation of electrode material while the lamp is on, as no electrode is used inside the discharge lamp. Thus, the advantage of this technology is that a discharge lamp having a long lifetime can be provided.

FIG. 6 shows the constitution of the electrodeless discharge lamp disclosed in JP-A-61-193385 at the time of emitting laser light as one example of semiconductor exposure devices using an electrodeless discharge lamp based on laser excitation. The semiconductor exposure device 101 is composed of a laser oscillator 102, an optical component 103 for adjusting laser light emitted from the laser oscillator 102 to a desired diameter, an optical component 104, a condenser lens 105 for condensing the laser light, an electrodeless discharge lamp 106 for emitting the laser light condensed by the condenser lens 105, an elliptical reflector 107 for reflecting ultraviolet light emitted from the electrodeless discharge lamp 106, and an optical system 108 for emitting the ultraviolet light reflected by the elliptical reflector 107 to a semiconductor wafer 121, an article to be treated. Moreover, the elliptical reflector 107 is provided with a laser beam inlet 110a for the incident laser light and a laser beam outlet 110b for exiting laser light, which is not absorbed by the elliptical reflector 107 and passes therethrough, to the outside of the elliptical reflector 107. The laser light exiting from the laser beam outlet 110b is absorbed by a light absorbing plate 109 to be converted into heat, for example, so that the laser light cannot be brought back to the laser oscillator 102.

However, the arrangement disclosed in JP-A-61-193385, as shown in FIG. 6, has the following problem. In order to supply energy to the electrodeless discharge lamp 106, the side faces of the elliptical reflector 107 are provided with the laser beam inlet 110a and the laser beam outlet 110b, and laser light is emitted to the electrodeless discharge lamp through the openings 110a, 110b. Hence, the problem is that the provision of the openings 110a, 110b on the side faces of the elliptical reflector 107 leads to a decline in the original function of the elliptical reflector 107, i.e., condensing ultraviolet light generated from the electrodeless discharge lamp. In other words, the generated ultraviolet light cannot effectively be utilized.

Furthermore, if the openings 110a, 110b provided on the elliptical reflector 107 are made small, the angle of incidence of laser light on the electrodeless discharge lamp 106 becomes small. In the event of emitting high energy, the energy density of laser light passing through the discharge vessel becomes too high, which may lead to various problems including a hole being generated in the discharge vessel of the lamp. If the openings 110a, 110b are made large for the incoming laser light in order to reduce the energy density of the laser light, the problem is that ultraviolet light emitted from the electrodeless discharge lamp 106 cannot effectively be used, as described above.

SUMMARY OF THE INVENTION

In order to solve the abovementioned problems, the present invention is to provide an exposure device used for producing semiconductors, liquid crystals, color films and the like, which has an optical system capable of effectively using generated light without causing a disadvantage, i.e., making a hole in a discharge vessel, in the event that high energy using laser light is supplied to a discharge lamp for emitting light such as ultraviolet light.

The exposure device according to a first aspect of the invention is characterized by having a light source for emitting ultraviolet light, a laser device for emitting laser light for supplying energy to the light source, an elliptical reflector for reflecting ultraviolet light emitted from the light source, and an optical system, which is disposed at the first focal point of the elliptical reflector, for directing light emitted from the light source and reflected at the elliptical reflector to an article to be treated via optical elements including a collimator lens and an integrator lens, wherein a beam splitter having a wavelength selecting function is provided in the optical passage for light reflected by the elliptical reflector in order to make laser light incident on the light source from the opening side of the elliptical reflector.

The exposure device according to another aspect of the invention is characterized in that the laser device is disposed in such a manner that emitted laser light diverges toward the periphery of the elliptical reflector based on the second focal point of the elliptical reflector.

The exposure device according to a further aspect of the invention is characterized in that the laser device has a lens disposed between the exit port of laser light and the beam splitter for collimating or converging the laser light.

The exposure device according to a further aspect of the invention is characterized in that the light source has a pair of electrodes, which face each other within a discharge vessel, power supply parts electrically connected to the electrodes protrude from both ends of the bulb portion in a manner of connecting the electrodes, and the lamp axis passing through each of the power supply parts substantially agrees with the longitudinal axis of the elliptical reflector.

The exposure device according to yet another aspect of the invention is characterized in that the laser device has a member on the exit side of laser light for forming a hollow light passage.

The exposure device according to another aspect of the invention is characterized in that the beam splitter is provided on the light source side away from the integrator lens in the optical passage where light is substantially in parallel.

The exposure device according to a still further aspect of the invention is characterized in that the beam splitter is provided on the light source side away from the second focal point of the elliptical reflector and on the line connecting the first focal point with the second focal point of the elliptical reflector.

The exposure device according to another aspect of the invention is characterized in that the beam splitter is provided somewhere between the second focal point, which is in the optical passage of light emitted from the elliptical reflector, and the collimator lens.

The exposure device according to still another aspect of the invention is characterized in that the beam splitter has a planar shape.

The exposure device according to another feature is characterized in that the beam splitter has a curved shape.

Effect of the Invention

According to the description of the first aspect of the invention, laser light is incident on the opening side of an elliptical reflector, which eliminates the need for providing the elliptical reflector with a laser beam inlet or an outlet for laser light. Therefore, ultraviolet light emitted from the light source can effectively be used without allowing for any leakage from the elliptical reflector. Furthermore, since the diameter of the laser beam can be enlarged to the entire opening portion of the elliptical reflector, the energy density of the laser light can be reduced at a time when the laser light passes through the discharge vessel of the light source. Accordingly, such problems as making a hole in the discharge vessel can be avoided.

Moreover, in order to make laser light incident on the opening side of the elliptical reflector, the laser device must be disposed in the optical passage for the ultraviolet light emitted from the opening side of the elliptical reflector; therefore the laser device tends to shield the ultraviolet light, thus decreasing the utilization efficiency of the ultraviolet light emitted from the light source.

According to the description of the first aspect of the invention, a beam splitter is provided in the optical passage, and the laser device is disposed outside the optical passage. As a result, the ultraviolet light emitted from the light source is not blocked, and light emitted from the light source can efficiently be used at the elliptical reflector.

According to an embodiment the invention, the laser device is disposed in such a manner that emitted laser light diverges toward the periphery of the elliptical reflector based on the second focal point of the elliptical reflector. Since the incoming passage of the laser light and the reflecting passage of the elliptical reflector, which reflects light emitted from the light source, overlap each other, the laser light can reliably be condensed on the light source, which is disposed on the first focal point of the elliptical reflector, by the elliptical reflector. As a result, laser light can efficiently be utilized.

According to another embodiment of the invention, a lens for collimating or converging laser light is disposed somewhere between the laser exit port of the laser device and the beam splitter. Therefore, laser light can reliably be condensed on the first focal point of the elliptical reflector (i.e., the light source) no matter where the beam splitter is disposed in the optical passage of the exposure device.

According to still another embodiment of the invention, the lamp axis of the light source agrees with the longitudinal axis of the elliptical reflector. Accordingly, the projected area as seen from the opening side of the elliptical reflector becomes small. The advantage is therefore that laser light directly incident on the power supply parts of the light source (i.e., laser light incident on the elliptical reflector, which is blocked by the power supply parts) decreases so that laser light can efficiently be condensed on the light source.

According to a further embodiment of the invention, laser light incident on the elliptical reflector has a hollow profile. "Hollow profile" here means that the light intensity profile of the light has a midsection where the light intensity is reduced or even null. For example, the cross-section of the laser beam can be ring-shaped or doughnut-shaped. Accordingly, the light source is not directly be irradiated by laser light incoming from the opening side of the elliptical reflector (i.e., all the laser light incident on the elliptical reflector is reflected and condensed). Therefore, the light source is not excessively heated, and laser light can efficiently be used.

According to yet another embodiment of the invention, the beam splitter is provided in the optical passage where light is substantially in parallel before the laser light is irradiated, which eliminates the need for considering the focal position, etc. so as to arrange the laser device. Laser light can therefore be condensed on the light source reliably via the elliptical reflector.

Furthermore, the temperature increase of the beam splitter can be suppressed because the laser light incident on the beam splitter is diverged as widely as the ultraviolet light propagated from the light source.

According to an aspect of the invention, the beam splitter is provided on a line connecting the first focal point with the second focal point of the elliptical reflector for emitting the laser light. Accordingly, the exposure device can easily be arranged, and laser light can reliably be condensed on the light source via the elliptical reflector.

The further advantage is that the existing optical system can be used without changing its disposition at all, and therefore it is convenient, because what is required is only to substitute the beam splitter for an optical component (i.e., a reflecting mirror) disposed on a line connecting the first focal point with the second focal point of the elliptical reflector in the optical system of a conventional exposure device.

Moreover, if the laser light has a wavelength in the infrared region, a cold mirror can be used at a low cost that reflects ultraviolet light from the light source and allows infrared light to pass therethrough.

According to another aspect of the invention, the advantage is that a space for disposing the beam splitter can easily be secured in the optical system of a conventional exposure device.

Another advantage is that the laser device can be stored in an empty space in the optical system of a conventional exposure device by orienting the beam splitter in a proper manner, thereby avoiding the necessity to increase the size of the exposure device.

According to a further embodiment of the invention, the beam splitter has a planar shape. The advantage is therefore that it is easy to design a dielectric multilayer film formed on the beam splitter.

According to a still further aspect of the invention, the beam splitter has a curved shape. The advantage is therefore that there is no need for providing a lens on the laser exit port side of a laser device, thereby reducing the size of the device.

The exposure device according to the present invention is provided with a pair of electrodes that face each other in a discharge vessel (wherein power supply parts protrude from opposite ends of the discharge vessel for supplying power to the electrodes), a light source for emitting ultraviolet light and an elliptical reflector for reflecting light emitted from the light source, and is used to irradiate an article to be treated via an optical system containing a collimator lens and an integrator lens, wherein a beam splitter having a wavelength selecting function is provided in the optical passage for emitting laser light to the light source from the opening side of the elliptical reflector.

BRIEF DESCRIPTION OF DRAWINGS

FIG. 5 is a schematic sectional view showing a cone lens.
FIG. 6 is a schematic view showing a conventional exposure device.

DETAILED DESCRIPTION OF THE INVENTION

Embodiment 1

Figure 1:
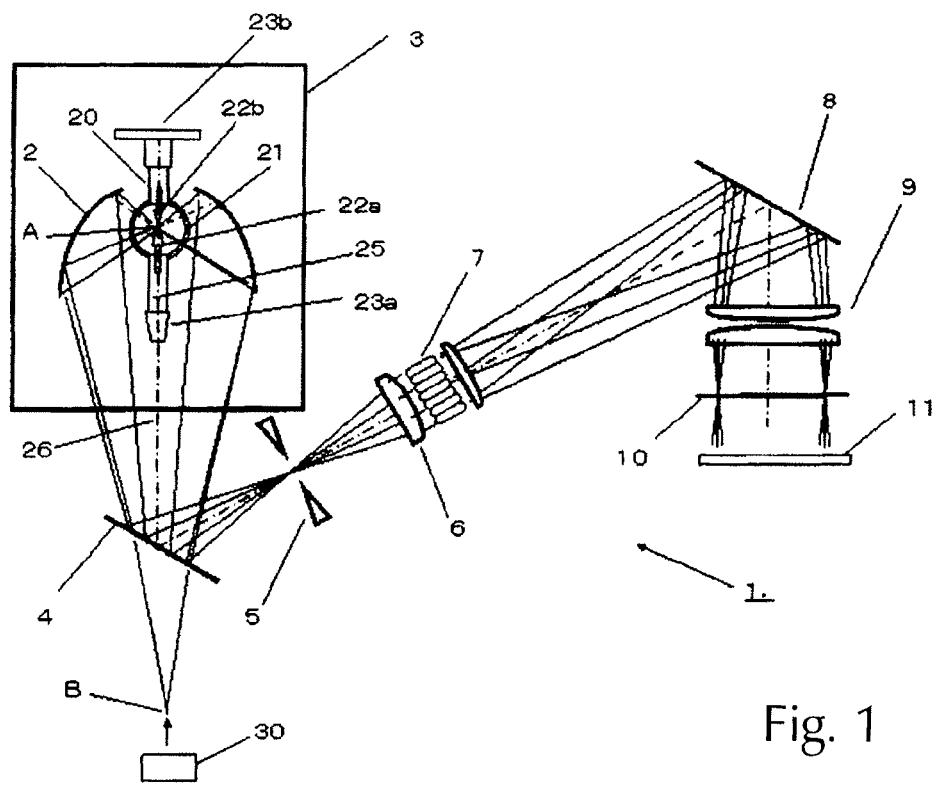
FIG. 1 is a schematic view showing Embodiment 1 of the exposure device according to the present invention.

FIG. 1 shows a first embodiment of the exposure device 1 according to the present invention. In FIG. 1, a light source 20 and an elliptical reflector 2 are disposed within a lamp housing 3. Light emitted from the light source 20 is reflected by the elliptical reflector 2, changes its direction at a flat panel-type beam splitter 4, and then is condensed in the vicinity of an aperture 5. Subsequently, the light changes its traveling direction again at a planar mirror 8 after passing through a collimator lens 6 and an integrator lens 7 to be radiated onto a surface to be irradiated such as a semiconductor wafer after passing through a second collimator lens 9 and a mask face 10.

In the present embodiment, the light source 20 is a high-pressure discharge lamp in which mercury is sealed. The light source 20 has a pair of electrodes (an anode and a cathode 22b) disposed within a discharge vessel 21 in an opposed manner, and power supply parts 23a, 23b for supplying power to the electrodes 22a, 22b protrude from opposite ends of the discharge vessel 21. A lamp axis 25, which passes through the power supply parts 23a, 23b, agrees with the longitudinal axis 26 of the elliptical reflector 2 (i.e., a first focal point A and a second focal point B when no member, such as a mirror, is disposed for changing the direction of light on the open side of the elliptical reflector 2). In the present embodiment, the discharge vessel 21 of the light source 20 is made of quartz glass and has a rugby ball shape. Inside the discharge vessel 20 is sealed a rare gas, such as xenon, and an emission material, such as mercury. In the present embodiment, the arrangement is such that the center of the light source 20 between the electrodes agrees with the first focal point A of the elliptic reflector 2.

In order to supply energy to plasma generated between the electrodes of the light source 20 using laser light, the diameter of the laser light emitted from a laser oscillator 30 is adjusted using an optical component, such as a beam expander, so that the diameter of the laser light is enlarged toward the opening edge of the elliptical reflector 2. In this case, the laser light is condensed on the space between the electrodes of the light source 20 disposed at the first focal point A of the elliptical reflector 2 by adjusting an angle of divergence of the laser light in a manner overlapping the optical passage of light reflected by the elliptical reflector 2. In the present embodiment, the laser oscillator 30 is disposed below the flat panel-type beam splitter in the drawing. The laser exit port 31 of the laser oscillator 30 is disposed on the longitudinal axis of the elliptical reflector 2 and on the second focal position (i.e., the second focal point B) before the traveling direction of light is changed by the flat panel-type beam splitter 4. In the present embodiment, a fiber laser was used for outputting infrared light having a wavelength of about 1 µm as the laser oscillator 30 because this type of laser is easy to handle and capable of generating laser light having a large output.

The beam splitter 4 is a flat-panel type and has a structure capable of passing laser light and reflecting light emitted from the light source 20. Specifically, beam splitter 4 allows infrared light having a wavelength of 1 µm emitted from the laser oscillator 30 to pass therethrough and reflects the i-line of mercury (ultraviolet light having a wavelength of 365 nm), which is the light emitted from the light source 20 and reflected by the elliptical reflector 2, and is generally used in semiconductor exposure. The beam splitter 4 is composed of a dielectric multilayer film formed by laminating $TiO_2$ and $SiO_2$ alternately, and by properly setting the thickness of the dielectric multilayer film and the total number of layers, beam splitter 4 allows laser light having a desired wavelength to pass therethrough and reflects light having a desired wavelength emitted from a light source.

Such a configuration allows laser light passing through the beam splitter 4 to be incident on the open side of the elliptical reflector 2, reflect on the elliptical reflector 2 and then be condensed on the light source 20. In this case, the advantage is that ultraviolet light emitted from the light source 20 can efficiently be condensed by the elliptical reflector 2 because there is no need for providing a opening and the like on the light reflecting surface of the elliptical reflector 2 for receiving laser light and, therefore, the entire reflecting surface of the elliptical reflector 2 can be used. Moreover, since laser light is made incident on the light source 20 via the elliptical reflector 2, laser light can be emitted to the light source 20 from the elliptical reflector 2 in a manner diverging on the entire reflecting surface of the elliptical reflector 2. Accordingly, it is possible to lower the energy density per unit area of laser light passing through the discharge vessel 21 of the light source 20, leading to the effect of avoiding failures, such as that of a hole being made in the discharge vessel 21.

Embodiment 2

Figure 2:
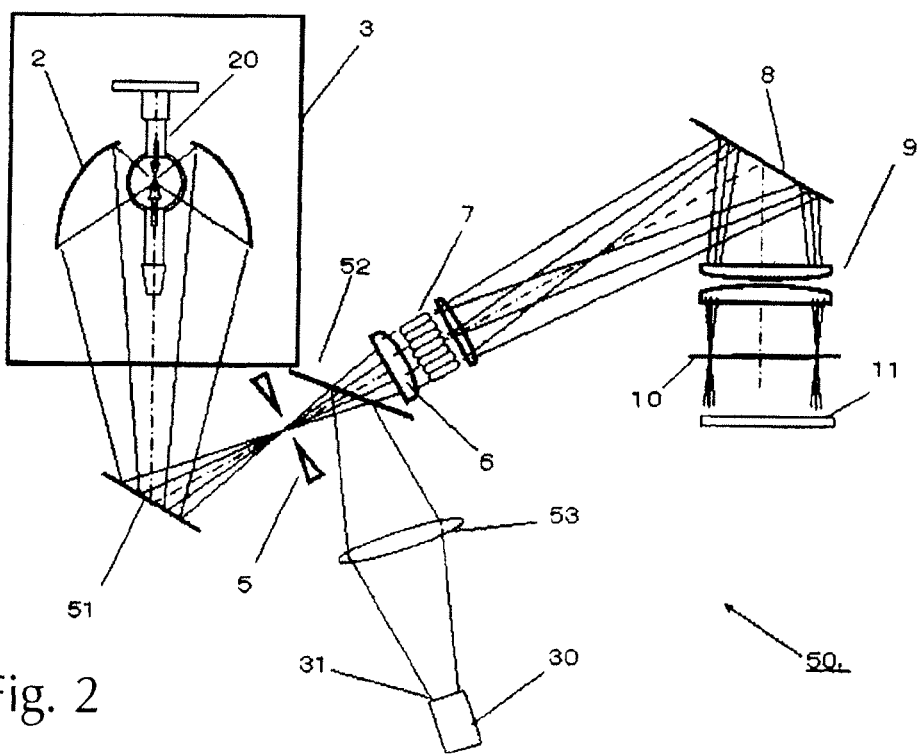
FIG. 2 is a schematic view showing Embodiment 2 of the exposure device according to the present invention.

FIG. 2 shows a second embodiment of the present invention. The exposure device 50 in FIG. 2 is substantially the same as the exposure device 1 as shown in FIG. 1 as far as the basic structure is concerned. Therefore, the same reference numerals as used in FIG. 1 are used for the same members. In FIG. 2, a light source 20 and an elliptical reflector 2 are disposed within a lamp housing 3. Light emitted from the light source 20 is reflected by the elliptical reflector 2, changes its direction at a planar mirror 51 that has a metal film, such as aluminum, deposited thereon, and then, is condensed in the vicinity of an aperture 5. Subsequently, the light changes its traveling direction again at a planar mirror 8 after passing through a collimator lens 6 and an integrator lens 7 to be radiated toward a surface to be irradiated, such as a semiconductor wafer, after passing through a second collimator lens 9 and a mask face 10.

In the present embodiment, a flat panel-type beam splitter 52 is disposed between the aperture 5 and the collimator lens 6. An infrared reflecting film is formed on the beam splitter 52 on the aperture side, and laser light emitted from a laser oscillator 30 (e.g., wavelength 1 μm) is made incident via a converging lens 53 and then reflected by the beam splitter 52 such that it can converge in the vicinity of the aperture 5. The converging lens 53 is capable of adjusting the diameter of laser light so that laser light emitted from the laser oscillator 30 can overlap the optical passage of light reflected by the elliptical reflector 2 and then diverge toward the opening edge of the elliptical reflector 2 after the laser light is once diverged by a beam expander or the like disposed at the laser exit port 31.

Laser light reflected by the beam splitter 52 is made incident on the opening side of the elliptical reflector 2 to supply energy to the light source 20. Ultraviolet light having a wavelength of 365 nm, for example, is emitted from the light source 20, which received energy from the laser light, is changed in its traveling direction by the planar mirror 51, goes through the aperture 5 and then passes through the beam splitter 52. Subsequently, the light is radiated onto the surface to be irradiated 11 after passing through the collimator lens 6, the integrator lens 7, the second collimator lens and the mask face 10.

The configuration of the second embodiment can be achieved simply by inserting and disposing the beam splitter 52 in the optical passage of an existing exposure device 50. The orientation of the beam splitter can be selected arbitrarily as far as it allows passing ultraviolet light therethrough and reflects the laser light. In the present embodiment, the laser oscillator 30 is disposed on the lower side, yet it may be disposed on the upper side instead. In other words, the orientation and arrangement of a beam splitter can freely be designed so that a laser device including the laser oscillator 30 and other optical system can be disposed in an empty space of the existing exposure device. The advantage is therefore that the size of the entire exposure device 50 can be reduced.

Embodiment 3

Figure 3:
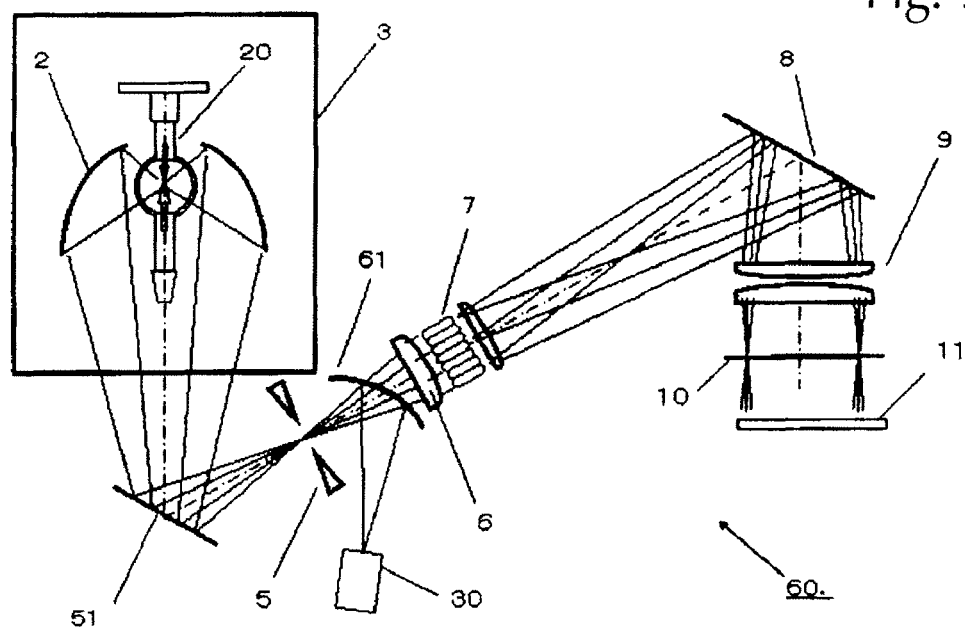
FIG. 3 is a schematic view showing Embodiment 3 of the exposure device according to the present invention.

FIG. 3 shows a third embodiment of the present invention. The exposure device 60 as shown in FIG. 3 is identical to the exposure device 50 of the second embodiment as shown in FIG. 2 as far as the basic structure is concerned. However, in the present embodiment, a curve-shaped beam splitter 61 is disposed in place of the beam splitter 52 as shown in FIG. 2. The beam splitter 61 is curve-shaped, and the configuration is such that its surface on the side of the aperture 5 can reflect laser light and allows passing light emitted from the light source 20 therethrough. Specifically, the beam splitter 61 is provided with a dielectric multilayer film for reflecting infrared light and transmitting ultraviolet light. In the present embodiment, the curved surface is designed such that laser light emitted from the laser oscillator and then diverged by a beam expander or the like can be condensed at the position of the aperture 5 by the beam splitter 61 and then diverged toward the opening edge of the elliptical reflector 2.

Thus, in the third embodiment, laser light emitted from the laser oscillator 30 can be condensed without depending on a converging lens because the beam splitter 61 has a curved shape, which leads the effect of reducing the size of the exposure device 30.

Embodiment 4

Figure 4:
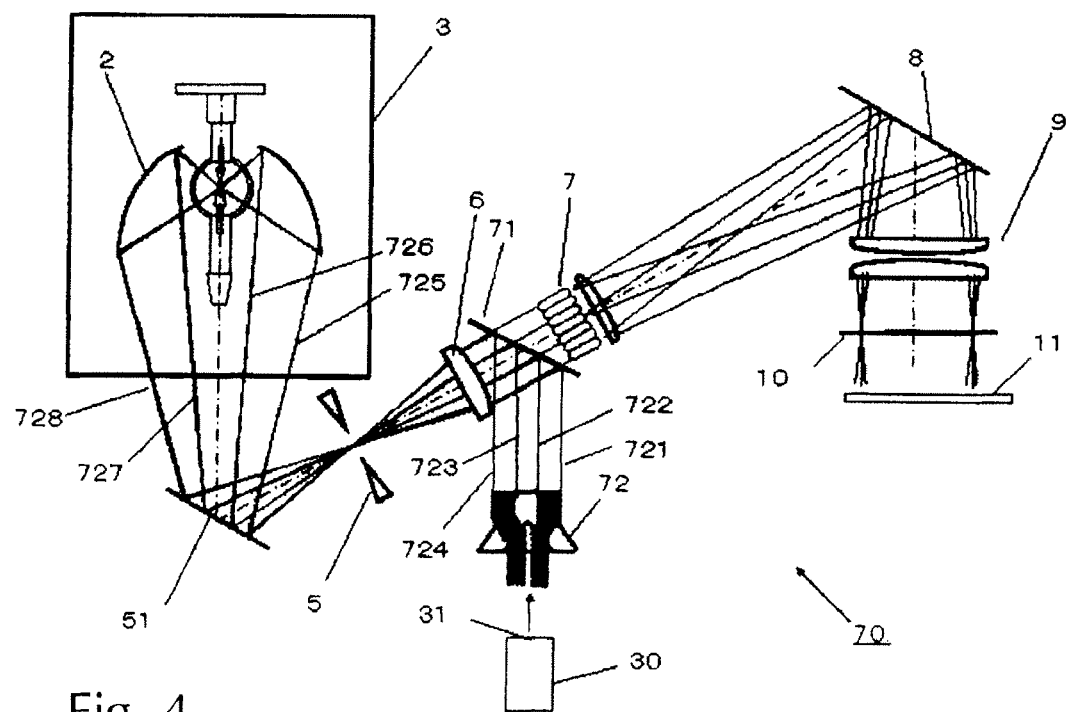
FIG. 4 is a schematic view showing Embodiment 4 of the exposure device according to the present invention.

FIG. 4 shows a fourth embodiment of the present invention. The exposure device 70, as shown in FIG. 4, is identical to the exposure device 50 of the second embodiment as shown in FIG. 2 as far as the basic structure is concerned. However, in the present embodiment, the device is provided with a flat panel-type beam splitter 71 equivalent to the beam splitter 52 as shown in FIG. 2, but it is disposed between a collimator 6 and an integrator 7, i.e., a portion of the device where light reflected by the elliptical reflector 2 is substantially in parallel. For the laser light incident on the beam splitter 71, a conic lens 72 is disposed, for example, as a member for forming a hollow light passage, which is located on the exit port side of the laser oscillator 30.

A description of the conic lens 72 is given below. FIG. 5 shows a sectional view of the conic lens 72 taken along the light entering direction. The conic lens 72 is an optical element having a meniscus structure, which is composed of a light refracting part 76 made of a glass body and a substantially cone-shaped light exit part 75, wherein laser light is incident on the entrance face 77, which is a substantially cone-shaped recess.

As shown in FIG. 5, laser light emitted from the laser exit port 31 of the laser oscillator 30 (as its optical passage is shown with an arrow), is bifurcated at the entrance face 77 of the conic lens 72, passes through the light refracting part 76 so as to be converted into ring-shaped or doughnut-shaped light (wherein there exists no light at the central portion of the laser light in the radial direction) and then exits from the light exit part.

In the exposure device in FIG. 4, laser light emitted from the laser oscillator 30 is converted by the conic lens 72 into ring-shaped or doughnut-shaped light (hollow light), wherein there exists no light at the central portion of the laser light in the radial direction. Specifically, the laser light is formed by the conic lens 72 in the radial direction as follows. The portion between the outer part 724 and the inner part 723 has light, and the portion between the inner part 722 and the inner part 723 has no light, forming a hollow portion. This hollow light is made incident on the elliptical reflector 2 in the following manner. The outer part 721 of the laser light at the time of exiting the conic lens 72 corresponds to the outer part 725 incident on the opening edge at the time of being incident on the elliptical reflector 2. Also the outer part 724 corresponds to the outer part 728. Similarly, the outer part 722 of the laser light at the time of exiting the conic lens 72 corresponds to the outer part 726 incident on the opening edge at the time of being incident on the elliptical reflector 2. Also the inner part 723 corresponds to the inner part 727.

Thus, in the fourth embodiment, laser light exited from the laser oscillator 30 is converted by the conic lens 72 into hollow light, wherein there exists no light at the central portion of the laser light in the radial direction, and this hollow light is made incident on the elliptical reflector 2. In this case, the advantage is that laser light is not made directly incident on the power supply part 23a of the light source 20 or the discharge vessel 21 from the opening side of the elliptical reflector 2 and that laser light can efficiently be made incident on the light source 20 from the elliptical reflector 2. The further advantage is that the light source 20 is not excessively heated by laser light so that the laser light can be used efficiently because the laser light is not made directly incident on the power supply part 23a of the light source 20 or the discharge vessel 21.

What is claimed is:
1. An exposure device comprising:
a light source for emitting ultraviolet light,
a laser device for emitting laser light for supplying energy to the light source,
an elliptical reflector for reflecting ultraviolet light emitted from the light source, and an optical system for directing light emitted from the light source onto an article to be treated, wherein the light source is disposed at a first focal point of the elliptical reflector, wherein the optical system comprises optical elements including a collimator lens and an integrator lens, wherein a beam splitter having a wavelength selecting ability is provided in an optical path of light reflected by the elliptical reflector to allow laser light from the laser device to be incident on the light source from an open side of the elliptical reflector.

2. The exposure device according to claim 1, wherein the laser device is disposed in a manner causing emitted laser light to diverge toward a periphery of the elliptical reflector based on a second focal point of the elliptical reflector.

3. The exposure device according to claim 1, wherein the laser device comprises a lens disposed between the exit port of the laser device and the beam splitter for collimating or converging the laser light.

4. The exposure device according to claim 1, wherein the light source comprises a pair of opposed electrodes, a discharge vessel in which the electrodes are disposed; power supply parts electrically connected to the electrodes and protruding from opposite ends of the discharge vessel in a manner connecting the electrodes to a power source; and wherein a longitudinal axis of the lamp passing through each of the power supply parts coincides with a longitudinal axis of the elliptical reflector.

5. The exposure device according to claim 4, wherein the laser device, on its light exit side, comprises a member forming laser light with a hollow light intensity profile.

6. The exposure device according to claim 5, wherein the member is adapted to form light having a ring-shaped or doughnut-shaped cross-section.

7. The exposure device according to claim 1, wherein the beam splitter is provided on a light source side of and away from the integrator lens in a portion of the optical path where light is substantially in parallel.

8. The exposure device according to claim 2, wherein the beam splitter is provided on the light source side of and away from the second focal point of the elliptical reflector and on a line connecting the first focal point with the second focal point of the elliptical reflector.

9. The exposure device according to claim 1, wherein the beam splitter is provided between the second focal point, which is in the optical path of light emitted from the elliptical reflector, and the collimator lens.

10. The exposure device according to claim 9, wherein the beam splitter has a planar shape.

11. The exposure device according to claim 9, wherein the beam splitter has a curved shape.

12. The exposure device according to claim 1, wherein said laser device is positioned relative to said beam splitter such that a portion of the laser light emitted by the laser device is directed by the beam splitter to said reflector and another portion of the laser light emitted by the laser device is directed to the optical system.

* * * * *